United States Patent [19]

Tanida

[11] 4,300,109
[45] Nov. 10, 1981

[54] TURRET TYPE TELEVISION TUNER HAVING AN ELASTIC AND A RIGID SUPPORT DISC

[75] Inventor: Takeyoshi Tanida, Osaka, Japan
[73] Assignee: New Nippon Electric Co., Ltd., Osaka, Japan
[21] Appl. No.: 133,604
[22] Filed: Mar. 24, 1980
[30] Foreign Application Priority Data
Mar. 31, 1979 [JP] Japan .................. 54-39231
[51] Int. Cl.³ .................................... H03J 5/30
[52] U.S. Cl. ..................... 334/51; 29/453; 334/57
[58] Field of Search ................. 334/49–51, 334/56, 57; 29/453

[56] References Cited
U.S. PATENT DOCUMENTS

| | | | |
|---|---|---|---|
| 2,868,982 | 1/1959 | Carlson | 334/51 |
| 2,898,563 | 8/1959 | De Cola et al. | 334/50 X |
| 3,249,902 | 5/1966 | Warthan et al. | 334/50 |
| 4,128,821 | 12/1978 | Kato et al. | 334/51 |

FOREIGN PATENT DOCUMENTS

975608 11/1964 United Kingdom .................. 334/50

*Primary Examiner*—Paul L. Gensler
*Attorney, Agent, or Firm*—W. G. Fasse; D. F. Gould

[57] ABSTRACT

A turret type television tuner comprises a chassis subassembly including a chassis base, an electrical wiring sub-assembly fixed on the chassis base, and a rotor assembly including a turret secured to a selector shaft within the chassis base. The turret includes an insulating elastic support disc with integrally formed holes and tongues in divided radial sector portions of the perimeter, a rigid support disc with outwardly opened notches, elongated insulating coil units provided with cavities at one end portion thereof and intermediate grooves, and fine tuning screws located within the respective cavity for adjusting the inductance of the respective coil unit. Each tongue of the elastic support retains the respective screw to hold its position within the respective cavity. Each of the coil units is removably mounted around the two discs by inserting the slim end portion into respective holes in the divided radial sector portions of the elastic support disc, bending the respective radial sector portion forward in the axial direction, and engaging the grooved intermediate portion with a respective notch in the rigid support disc. Once a coil unit is set in a given position it is held in the given position due to the restoring force of the respective bent portion of the elastic support disc.

5 Claims, 16 Drawing Figures

TURRET TYPE TELEVISION TUNER HAVING AN ELASTIC AND A RIGID SUPPORT DISC

BACKGROUND OF THE INVENTION

This invention relates to a compact turret type tuner arrangement used in television receivers, and more particularly, to VHF turret television tuners constructed for facilitating the sub-assembly and the main assembly.

Generally, mechanical channel selecting devices for VHF television tuners fall into two groups, namely, the rotary-switching type or the turret type. Turret type tuners include an incrementally rotatably channel selector shaft for selectively connecting certain ones of a plurality of tuned circuit elements to each of a plurality of channel selector positions. For example, such turret tuner arrangements are disclosed in U.S. Pat. Nos. 3,210,700; and 4,128,821, wherein a turret having a plurality of tuning coil units is rotatably mounted on a chassis base. The selected coil unit is connected through terminal contacts to a stator tuning circuit on the chassis base.

The miniaturization of the structure of this kind of mechanical tuners is very difficult in comparison to the rotary switch tuners. However, since television tuners are made in large numbers, it is desirable to provide a low cost turret tuner with a minimum number of parts which may be assembled in an easy and simple manner, in order to be commercially competitive.

In conventional VHF turret tuners the coil units are removably mounted on two or more support discs, and each of the coil units includes an elongate insulator, a coil for an RF input stage, a pair of coils for an intermediate stage between the RF and mixer circuits, and a coil for the local oscillator stage. A screw slidably supported by means of a screw retainer is provided for fine tuning the local oscillator. These coils or windings are wound around the insulator, as disclosed, for example, in U.S. Pat. Nos. 3,227,981; 3,337,949; 3,521,677; 3,594,670; and 3,944,952. Therefore, many parts for turret tuners and complicated assemblies are required.

The conventional detent mechanism, as a means for mounting the rotatable turret on the chassis base, includes a detent wheel fixed on the selector shaft and a spring member mounted on the chassis base, as disclosed in U.S. Pat. Nos. 3,172,062; 3,234,801; 3,407,669; and 3,477,299. It is also known that this kind of spring member may provide resiliency in two different directions. In another type of turret tuner, a sub-assembly for the stationary circuits comprises a printed circuit board, a stator block having a plurality of strips of spring contacts, and necessary electrical elements soldered to each other, as disclosed in U.S. Pat. No. 3,365,621. The use of printed circuit boards sometimes causes stray capacitances harmful for receiving high frequency signals. Further, some devices including lever members, are known as pre-setting, fine tuning devices for VHF turret tuners as disclosed in U.S. Pat. Nos. 3,183,726; 3,316,770 and 4,172,390.

Conventional turret tuners still leave room for improvement, especially as far as minimizing the tuner size and dimension, and simplifying the assembly, as well as lowering the manufacturing costs and improving the tuner performance are concerned.

OBJECTS OF THE INVENTION

In view of the foregoing, it is the aim of the invention to achieve the following objects singly or in combination:

to provide a new turret type tuner especially for television receivers, wherein an improved, easily assembled construction miniaturizes and simplifies the tuner and reduces the number of required parts, and which tuner may be manufactured by sub-assembly techniques in an economic manner;

to provide a new and improved VHF tuner construction for mounting the electrical wiring assembly and the rotor assembly on the chassis base in such a sub-assembly manner that mass production methods may be employed; to provide a low cost and small size VHF turret type tuner by simplifying its electrical wiring assembly of soldered electrical elements and by reducing the number of parts of its rotor assembly; and to provide an improved and mechanically simplified turret mount having fine tuning elements for the preset memory type, wherein an improved easily constructed retaining member is provided for holding the fine tuning elements in each channel selecting position.

SUMMARY OF THE INVENTION

This invention provides a turret tuner with separable component sub-assemblies, one of which includes a main mechanical rotating portion and the other of which includes a main electrical portion. The mechanical portion includes a chassis base, a rotor turret with a detent biasing mechanism which couples the turret with the chassis base. The rotor turret comprises a channel selector shaft, two support discs fixed to the selector shaft and a plurality of coil units which are arranged on the periphery of support discs distributed about the selector shaft. The chassis base includes a front wall, a rear wall opposite the front wall, side walls, and a hollowed out top face. A spring strap is mounted on the chassis base. One end of the spring strap presses resiliently against a detent wheel supported on the selector shaft. The detent mechanism comprises the spring strap, the detent wheel proper, and the selector shaft within the chassis base. The electrical wiring assembly includes a grounded metal board, and electrical circuit elements connected to each other by soldering these elements on the grounded metal plate.

In accordance with one aspect of the invention, there is provided a turret type television tuner comprising a chassis sub-assembly including a chassis base and a stator bar provided with a plurality of spring contacts, a rotor sub-assembly including a turret and an index wheel on a selector shaft within the chassis base, and an electrical wiring sub-assembly including a grounded metal board and circuit elements connected to each other thereon. The turret includes a plurality of coil units, an elastic support disc with a plurality of holes, and a rigid support disc with a plurality of notches. Each of the coil units includes an elongated insulator provided with a slim end portion, an end cavity and an intermediate groove, coils forming a tuned circuit for each stage in cooperation with the electric wiring sub-assembly, and a fine tuning screw within the cavity for adjusting the inductance of the respective coil. The elastic support disc is provided with a plurality of holes for receiving the slim insulator end portion. A tongue near each of the holes reaches into the respective cavity for cooperation with the corresponding fine tuning screw to hold the fine tuning screw in its tuned position within the cavity of the elongated insulator. The coil units are mounted on only two discs by inserting the slim end portion into the holes of the elastic support disc by pushing in the forward axial direction for bending the elastic support disc, and engaging the groove of the insulator in the notch of the rigid support disc by pressing radially inwardly for setting the coil unit in a given position due to the restoring force of the elastic support disc in its bent state.

Further, in accordance with the invention, there is provided a detent biasing mechanism for the selector shaft within the chassis base, including a spring strap cooperating with the index wheel to form detent biasing means. The bias force of the spring strap is designed to keep the selector shaft in its proper position. One end of the spring strap is fixed along to the side wall of the chassis base and another end resiliently engages the index wheel for biasing the latter within the chassis base whereby the spring of the tuner is reduced due to the compact construction.

The electrical wiring sub-assembly of the invention includes a grounded metal board fixed to the chassis base for a reliable earth connection and an easy electrical connection between the terminal contacts on the rotor turret and the electrical wiring sub-assembly through the spring contacts secured to the stator bar. To assemble the wiring circuit board and stator bar in its respective position, each of the parts has lugs or cutout portions engaging with cutouts or lugs of the chassis base.

In accordance with the invention, there is also provided a connecting structure between the wiring circuit board and the chassis base, including inserting holes in the wiring grounded metal board and cutout lugs in the periphery of the top face wall of the chassis base. The top face wall is provided with a hollowed out portion where the wiring assembly is disposed. These lugs and holes are available for soldering the grounded metal board on the chassis base from the outside thereof.

A further turret type VHF tuner embodiment of this invention includes a compact memory fine tuning arrangement, wherein a push presetting type or a rotary presetting type may be employed to provide an improved fine tuning device.

Another characteristic feature of the invention is seen in that each of the fine tuning elements or screws for the local oscillator coil is held within the cavity of the elongated insulator of the coil units by the elastic support disc of the turret to make the whole assembly smaller as compared to prior art structures and to reduce the number of necessary parts for the fine tuning device. The smaller type tuner is useful for reducing the weight of the chassis base as well as reducing the required torque. The tuner of this invention is satisfactory in its performance which meets the requirements of color television sets and of black and white television sets.

BRIEF FIGURE DESCRIPTION

In order that the invention may be clearly understood, it will now be described, by way of example, with reference to the accompanying drawings, wherein.

Figure 1:
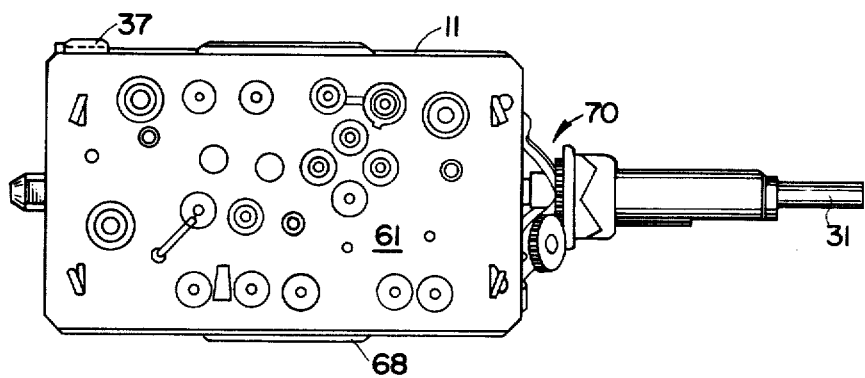
FIG. 1 is a top plan view of a turret type VHF tuner of this invention.
Figure 2:
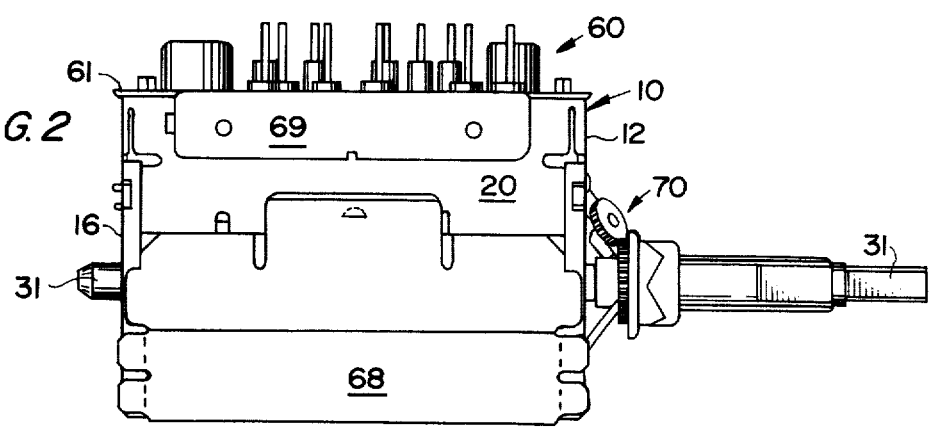
FIG. 2 is a side view of the tuner of FIG. 1.
Figure 3:
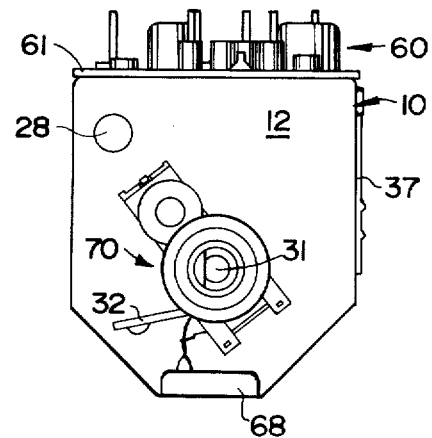
FIG. 3 is a front view of the tuner of FIG. 1.
Figure 4:
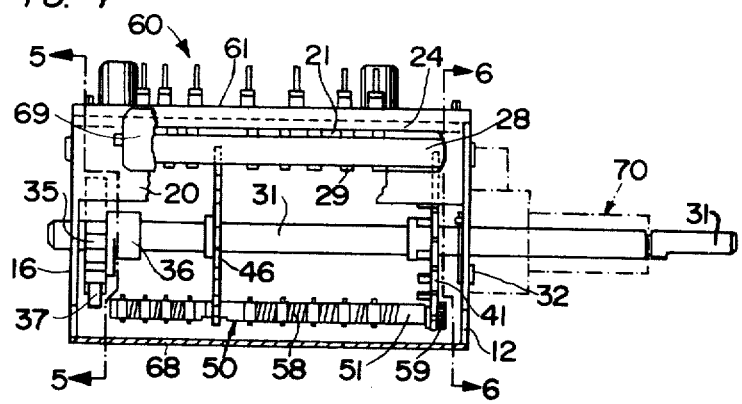
FIG. 4 is a side view similar to that of FIG. 2, partially in section and with the cover partially removed.

DETAILED DESCRIPTION OF PREFERRED EXAMPLE EMBODIMENTS AND OF THE BEST MODE OF THE INVENTION

The turret type VHF tuner of this invention, as particularly shown in FIGS. 1 to 7, includes three main sub-assemblies which are a chassis sub-assembly 10 including a chassis base 11 and a stator bar 28 with spring contacts 29, a rotor sub-assembly 30 including a turret 40 and an index detent wheel 35 secured to a channel stator shaft 31 within the chassis base 11, and an electrical wiring sub-assembly 60 including a grounded metal board 61 and circuit elements 62 operatively interconnected thereon. The selector shaft 31 is supported on the chassis base 11 for detent movement by means of a detent spring strap 37. The open sides of the chassis base 11 are shielded by a shield cover 68. A fine tuning device 70 is mounted on the selector shaft 31 for slightly tuning a circuit of the selected channel. It is noted that the fine tuning arrangement may be used for the common so-called manual tuning member for each channel. However, in practice the memory method for the fine tuning arrangement for each channel is preferred. The embodiment uses the fine tuning arrangement of the rotary-preset type as disclosed in copending application Ser. No.: 097,847 filed on Nov. 27, 1979. It may be possible to use, instead of a rotary-preset tuner, a push-preset type as disclosed in the pending application Ser. No. 014,828, filed on Feb. 26, 1979, now U.S. Pat. No. 4,253,074.

Figure 6:
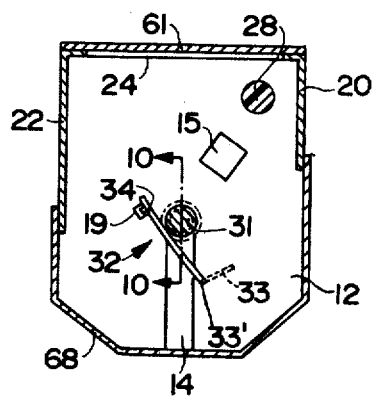
FIG. 6 is a sectional view taken along line 6—6 in FIG. 4.
Figure 7:
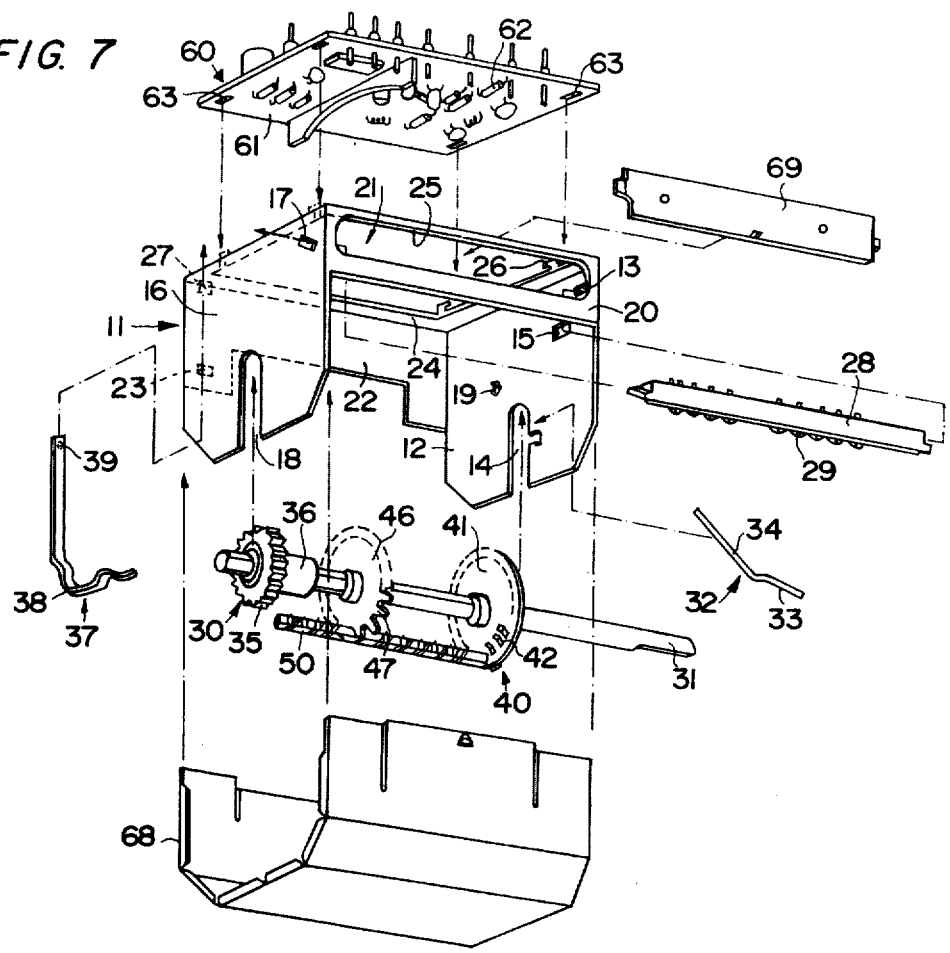
FIG. 7 is an exploded view of the tuner of FIG. 4.

In FIG. 7 the chassis base sub-assembly comprises the chassis base 11 of the U-shaped type having a front face wall 12, a rear face wall 16, side face walls 20, 22 and a top face wall 24 coupled to each other. The front and rear face walls 12, 16 at the right and left sides of the chassis base 11 are provided with deep notches 14, 18 for journalling the selector shaft 31. A detent mechanism described hereinafter holds the selector shaft in position. For receiving the stator bar 28, cutouts 13, 17 are located in both face walls 12, 16. As shown in FIG. 6, a hole 15 is provided in the front face wall 12 for the preset fine tuning device 70 shown by a dash-dotted line in FIG. 4. A window 21 is provided on the first side wall 20 mainly for the purpose of connecting electrically a plurality of spring contacts 29 of the stator bar 28 and the wiring assembly 60 by a conducting adhesive or by soldering. The window 21 is covered with a shield plate 69 after all assembly steps are completed from the outside. A hollowed out portion 25 is provided on a top face wall 24 of the chassis base 11 on which the electrical wiring sub-assembly 60 is disposed. The wiring sub-assembly 60 includes the grounded metal board 61 in the form of a piece of sheet metal plated with Sn-Pb for good solderability. At several places on the periphery of the top face wall 24, four projections 26 are provided for retaining of the wiring sub-assembly 60. These projections may be made as part of the chassis base by a stroke of the punch press, and they are bent upwards. The use of the metal board 61 for the wiring sub-assembly 60 is one feature of the present invention. This feature provides a good grounding effect and reduces stray capacitances without using a conventional printed circuit board.

Figure 8:
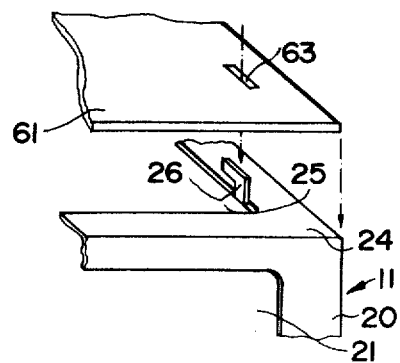
FIG. 8 is an exploded view of the assembly of the chassis base and the wiring board of FIG. 7.
Figure 9:
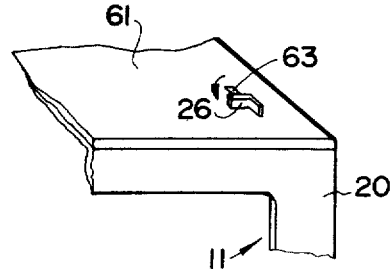
FIG. 9 is a perspective view of the assembly of FIG. 8.

Corresponding to the retaining projections 26 on the chassis base 11, four retaining holes 63 are provided on the grounded metal board 61 to secure the board 61 to the base 11. The board 61 with its wiring sub-assembly 60 is secured to the chassis base 11 by inserting each projection 26 into the corresponding retaining hole 63, as shown in FIGS. 8 and 9, and then bending each top portion of the retaining projections 26 as shown in FIG. 9, whereby the electrical wiring sub-assembly 60 is secured to the top face flange 24 of the chassis base 11. The sub-assembly 60 may also be secured to the flange 24 in any other suitable way.

Figure 5:
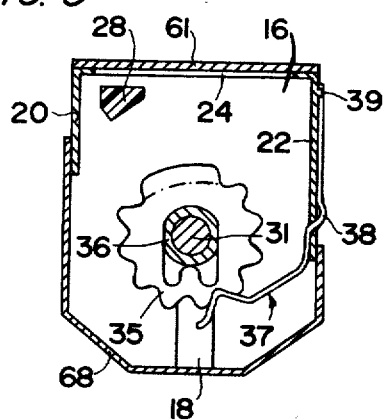
FIG. 5 is a sectional view taken along line 5—5 in FIG. 4.

The detent mechanism with the detent wheel 35 is mounted concentrically on the selector shaft 31 as shown in FIG. 5. The detent wheel 35 is disposed inside of the chassis base 11 on the end portion of the selector shaft 31. A hub portion 36 provided on the inner side of the detent wheel 35 extends inwardly to some extent for securing the detent wheel 35 in a stable manner and to effectively use the space surrounding the selector shaft 31. A detent spring strap 37, which resiliently presses and engages with a cam surface of the detent wheel 35 is bent, as shown in FIG. 7. The spring strap 37 is bent and retained on or secured to the chassis base 11. Thus, one end of the spring 37 resiliently cooperates with the detent wheel 35 while the other end 39 is secured to the chassis base 11 and an intermediate bent spring portion forms a fulcrum or lever to provide an index or stepped movement for the selector shaft. As shown in FIG. 7 a cutout 23 is provided in the second side face wall 22 of the chassis base 11. The spring strap 37 is bent about at a middle portion 38 which extends through the cutout 23. For example, the other end 39 of the spring strap 37 may be held by an extrusion 27 on the side face wall 22 of the chassis base 11. The bent portion 38 of the spring strap 37 makes resilient contact with the inside surface of the side face wall 22 as a fulcrum, whereby the wheel 35, due to the resilient force of the spring 37, makes sure that the selector shaft 31 may be rotated in fixed steps. The movement of the spring strap 37 in the horizontal and vertical directions is properly restricted by the described three point support at the end portion resiliently contacting the wheel, 35, the bent portion 38, and the retained end portion 39. The spring strap 37 is easily inserted into the cutout 23 and is easily taken out at the retained end portion 39. The spring strap 37 assures a smooth intermittent rotation of the selector shaft 31. At the same time, the retention of the selector shaft 31 in the notch 18 of the face wall 16 is assured by the resilient pressure of the spring strap 37.

Figure 10:
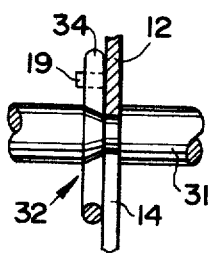
FIG. 10 is a sectional view taken along line 10—10 in FIG. 6.

The shaft bearing member 32 retains the selector shaft 31 in the notch 14 of the front face wall 12, as shown in FIGS. 6 and 10. The member 32 has an outside arm 33 and an inside arm 34 bent substantially perpendicularly relative to each other. The member 32 is retained by a stop 19 provided on the inside of the front face wall 12 and a recess 33' formed in the deep notch 14 of the front face wall 12. After the selector shaft 31 is inserted into a bearing portion of the deep notch 14, the outside arm 33 of the bearing member 32 is inserted through the recess 33' from the inside outwardly, whereby the outside arm 33 is held in the recessed portion and the free end portion of the inside arm 34 is resiliently held in position by the punched out stop 19. According to the above arrangement, a tapered portion of the selector shaft 31, as shown in FIG. 10, is resiliently contacted approximately by the middle portion of the arm 34, whereby the selector shaft 31 is prevented from falling out of the notch 14. Since the arm 34 also engages a groove or shoulder in the shaft 31 the latter cannot move in the axial direction. Due to the disposition of the bearing member 32 on the inner side of the front face wall 12, a wider free space is provided for the fine tuning device 70.

Figure 11:
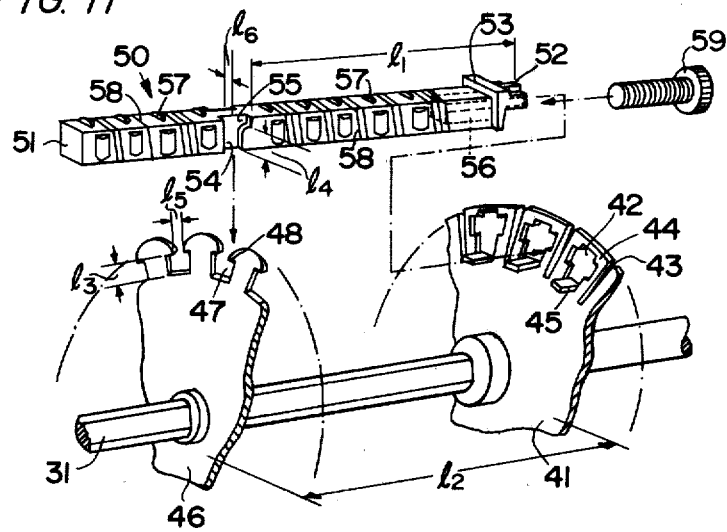
FIG. 11 is an exploded view of the rotor assembly of FIG. 7.

The turret 40 includes an elastic support disc 41 with a plurality of holes 42, a rigid support disc 46 with a plurality of notches 47, and a plurality of coil units 50. Each coil unit comprises an elongated insulator 51 provided with a slim end portion 52 and an intermediate grooved portion 54, terminal contacts 57, coils 58 wound around the insulator 51 to constitute a tuned circuit for each stage in cooperation with the electric wiring sub-assembly 60, and a fine tuning screw 59 located within a cavity 56 of the insulator 51 for adjusting the inductance of the respective coil as shown in FIG. 11. The elastic support disc 41 has a plurality of tongues 45, each of which retains the screw 59 to hold its position within the cavity 56 of the insulator 51. Each of the coil units 50 is removably mounted around both discs 41, 46 by inserting or pushing the slim end portion 52 of the insulator 51 into the respective hole 42 of the elastic support disc 41. The pushing force is exerted in the axial direction for bending the elastic support disc 41. For engaging the grooved portion 54 of the insulator 51 with the respective one of the notches 47 of the rigid support disc 46 pressure is applied in the inward radial direction whereby the coil unit 50 is held in a defined position due to the restoring force of the elastic support disc 41 in its bent state. At the end portion of the insulator 51 the slim end portion 52 and a stop shoulder 53 are provided to position the insulator at the periphery of the elastic support disc 41. The intermediate portion of the insulator 51, is provided with a vertical groove 54 which is wider than the thickness of the rigid support disc 46, and with a lateral groove 55 having a length of about the thickness of the rigid support disc 46. The lateral groove 55 is located in the forward direction toward the disc 41. The upper portion of the vertical groove 54 is connected with the lateral groove 55. A length l1 between the end wall of the lateral groove 55 and the stopping portion 53 corresponds substantially to a length l2 between the inward surfaces of the elastic support disk 41 and the rigid support disc 46.

To achieve a two point support of the coil unit 50, on the periphery of the elastic support disc 41 a number of slits 43 corresponding to the number of coil units are spaced at equal intervals. Each divided disc portion 44 is provided with a receiving hole 42 to retain the inserted slim end portion 52 of the coil unit 50. A tongue 45 for holding a fine tuning screw 59 is provided at a lower end of each receiving hole 42. Further, the elastic support disc 41 is made, for example, of plastics material which has elastic and insulating characteristics. Each of the coil units 50 is disposed by utilizing the elasticity as described below. The rigid supporting disc 46 is made of conductive sheet metal and grounded to shield high frequency electric signals. A plurality of receiving notches 47 aligned respectively with the receiving holes 42 of the elastic support disc 41 are provided on the periphery of the support disc 46 at the same intervals. Inward projections 48 are provided on both sides of the receiving notch 47. The height 13 is almost the same as the height 14, from the bottom of the vertical groove 54 to the lateral groove 55 of the coil unit 50. The interval 15 between neighboring projections 48 is almost the same as the interval 16 between opposite vertical grooves 54 on both sides of the coil unit 50.

Figure 12A:
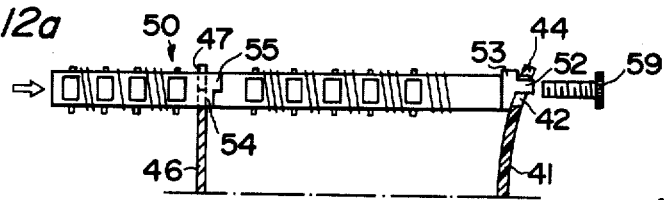
FIGS. 12a and 12b are sectional views showing each of the mounting steps of the coil units of FIG. 11.
Figure 13:
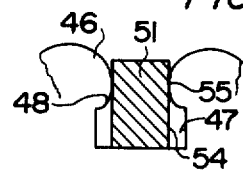
FIG. 13 is a sectional view taken along line 13—13 of FIG. 12b.
Figure 12B:
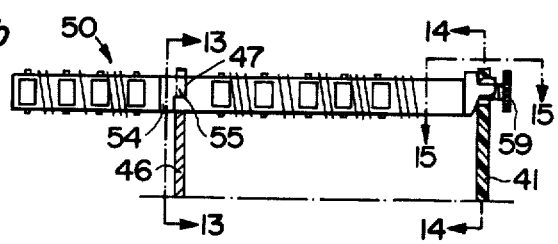
Figure 14:
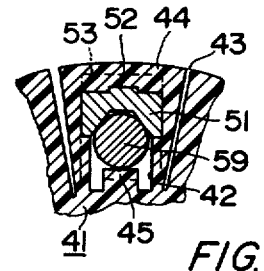
FIG. 14 is a sectional view taken along line 14—14 of FIG. 12b.

The coil unit 50 is attached to the first and second support discs as follows. First, the slim end portion 52 of the coil unit 50 is inserted into a given receiving hole 42 from the inside of the elastic support disc 41 until the stopping projection 53 touches the receiving hole 42. Then, the coil unit 50 is pushed forward with the elastic support disc 41 to bend the divided portion 44 outwardly by the stopping projection 53. In such a state the vertical intermediate groove 54 of the coil unit 50 is inserted into the receiving notch 47 through the projections 48 on the rigid support disc 46. As shown in FIG. 12a, the coil unit is inserted into the rigid support disc 46 when the coil unit is in a slightly advanced position due to the resilient travel of the elastic support disc 41. The resilient force of the elastic support disc 41 then pushes the coil unit in the opposite direction so that the projections 48 on the receiving notch 47 slide along the lateral groove 55 and are stopped at the end portions of the lateral groove. Thus, the insertion of the coil unit 50 in the support discs 41 and 46 is completed, as shown in FIG. 12b. Hence, the projections 48 are received in the lateral groove 55, as shown in FIG. 13, and the slim end portion 52 is still retained in the receiving hole 42, as shown in FIG. 14. Accordingly, each coil unit 50 is properly retained by both support discs 41 and 46. For removing a coil unit 50 from these support discs, the coil unit is pushed and moved in the forward direction toward disc 41 and is disengaged from the rigid support disc 46 and pulled out of the elastic support disc 41.

Figure 15:
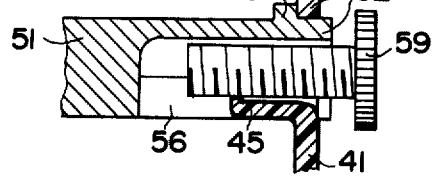
FIG. 15 is a sectional view taken along line 15—15 of FIG. 12b.

After the positioning of the coil unit 50 is completed, the fine tuning screw 59 is moved into the cavity 56 (FIG. 15) of the insulator 51 simply by pushing the fine tuning screw 59 into the cavity 56 from the outside of the receiving hole 42 in the elastic support disc 41. The screw 59, as shown in FIG. 15, is movably retained between the wall of the cavity 56 and the tongue 45 on the elastic support disc 41. The screw 59 may be moved back and forth by its rotation due to the engagement of the screw threading with the tongue 45, when the fine tuning device is operated.

As described above, due to the arrangement that the electrical wiring assembly is attached to the chassis base by an inserting method, that a detent mechanism is provided inside of the chassis base, and that further coil units are retained by two supporting discs according to the invention, the assemblying of the present tuner is simplified. Due to the turret mounted assembly and the disposition of the detent mechanism within the chassis base, it is possible to provide a turret type tuner having a short width and a small, compact size. Further, since the use of spring supported discs which resiliently hold the coil units in conventional tuners has been eliminated, it is now possible, according to the invention, to reduce the number of parts and to provide a low cost tuner.

Although the invention has been described with reference to specific example embodiments, it will now be appreciated, that it is intended to cover all modifications and equivalents within the scope of the appended claims.

What is claimed is:

1. A turret type tuner with memory fine tuning arrangements comprising: chassis base means including front and rear wall means; selector shaft means journalled in said front and rear wall means; an elastic support disc made of insulating plastic material secured to said selector shaft means; a rigid support disc made of conductive material secured to said selector shaft means and spaced from said elastic support disc; a plurality of coil units operatively arranged on the periphery of said elastic support disc and said rigid support disc, each of said coil units including an elongated insulator with a cavity at one end portion thereof, terminal contacts fixed to said insulator, and a plurality of coil means wound on said insulator and connected to said terminal contacts and a plurality of fine tuning elements movably positioned within said respective cavities for adjusting the inductance of the coil means located at said one end portion of said elongated insulators; the elongated insulator of each said coil unit being provided with a slim end portion and an intermediate grooved portion, said elastic support disc including a plurality of divided radial sector portions separated from each other by slit means for independent resilient deflection, each divided portion being provided with a hole for receiving the slim end portion of the elongated insulator of a coil unit, said rigid support disc being provided with a plurality of notches for receiving the intermediate grooved portion of said elongated insulator, said coil unit being retained in place by deflecting the respective divided portion of the elastic disc for alignment of the intermediate grooved portion and respective rigid disc notch, and interlocking said grooved portion and notch under the restoring force of the deflected divided portion; said elastic support disc being provided with a plurality of tongue means at said respective divided portions adjacent said plurality of holes for retaining said fine tuning elements in cooperation with the cavities at the end portions of said elongated insulators, whereby each of said fine tuning elements may be adjusted for memory fine tuning.

2. The turret type turner of claim 1, wherein said elastic support disc is made by molding the disc integrally with said plurality of tongues, and each of said tongues being provided with an engaging end portion for retaining a respective one of said fine tuning elements, whereby the respective fine tuning element is kept in an adjusted position without requiring any auxiliary retaining means.

3. The turret type tuner of claim 1, further comprising detent biasing means on said selector shaft means, wherein said detent biasing means include a detent wheel secured to said selector shaft means within said chassis base means, and spring means provided with one end portion in resilient contact with said detent wheel, said spring means having another end portion secured to said chassis base means and an intermediate bent portion forming a fulcrum for permitting an indexing movement of said selector shaft means.

4. The turret type tuner of claim 1, further comprising electrical wiring means including a grounded sheet metal means and circuit elements interconnected on said grounded sheet metal means, said chassis base means having a cutout portion, said electrical wiring means and circuit elements being disposed adjacent said cutout portion, said sheet metal means being coupled mechanically with said chassis base means, said tuner further comprising a stator bar secured to said chassis base means and comprising spring contact means for electrically connecting said wiring means and said terminal contacts of selected ones of said coil units.

5. The turret type tuner of claim 4, further comprising shield cover means removably attached to said chassis base means.

* * * * *